United States Patent [19]
Tanaka et al.

[11] Patent Number: 5,446,694
[45] Date of Patent: Aug. 29, 1995

[54] SEMICONDUCTOR MEMORY DEVICE

[75] Inventors: Takayuki Tanaka; Junichi Suyama; Kazukiyo Fukudome; Yuki Hashimoto, all of Tokyo, Japan

[73] Assignee: Oki Electric Industry Co., Ltd., Tokyo, Japan

[21] Appl. No.: 225,968

[22] Filed: Apr. 8, 1994

[30] Foreign Application Priority Data

Apr. 28, 1993 [JP] Japan .................................. 5-102788

[51] Int. Cl.⁶ ............................................. G11C 11/34
[52] U.S. Cl. .................... 365/203; 365/207; 365/205; 365/202
[58] Field of Search ............... 365/203, 202, 207, 204, 365/226, 205, 189.09, 189.01, 196

[56] References Cited

U.S. PATENT DOCUMENTS

| | | | |
|---|---|---|---|
| 4,709,353 | 11/1987 | Shimohigashi et al. | 365/205 |
| 5,337,270 | 8/1994 | Kawata et al. | 365/203 X |

FOREIGN PATENT DOCUMENTS

| | | | |
|---|---|---|---|
| 0071579 | 5/1982 | Japan | 365/203 |
| 0178687 | 10/1984 | Japan | 365/203 |
| 0239913 | 10/1987 | Japan | 365/203 |
| 63-78394 | 4/1988 | Japan | |

*Primary Examiner*—Joseph A. Popek
*Assistant Examiner*—Huan Hoang
*Attorney, Agent, or Firm*—Frishauf, Holtz, Goodman & Woodward

[57] ABSTRACT

A semiconductor memory device of the present invention comprises an internal power supplying circuit electrically connected to an external power supply having an external source potential and for supplying an internal potential lower than the external source potential, a precharging circuit for supplying a half potential of the internal potential to each of memory cells and bit lines, and a switching circuit electrically connected between each bit line and the precharging circuit and controlled based on an equalize signal output from a control circuit and having the same potential as the external source potential. The semiconductor memory device of such a type that even if a potential on each bit line increases excessively, such a potential does not exert an influence on each memory cell, can be realized owing to the above structure.

11 Claims, 15 Drawing Sheets

SEMICONDUCTOR MEMORY DEVICE

REFERENCE TO RELATED APPLICATIONS

This application claims the right of priority under 35 U.S.C.119, of Japanese Application Serial No. 05-102788, filed on Apr. 28, 1993.

BACKGROUND OF THE INVENTION

1. Field of the Invention

This invention relates to a semiconductor memory device capable of preventing an excessive potential from being applied to a memory cell.

2. Description of the Related Art

A semiconductor memory device such as a Dynamic Random Access Memory (hereinafter called a "DRAM") has bit lines respectively electrically connected to memory cells and a sense amplifier for amplifying a potential on each bit line during a predetermined period. In order to realize a high-speed operation, each of the bit lines is normally charged to a predetermined potential by a precharging circuit during a period prior to the predetermined period.

Such a DRAM has been disclosed in U.S. Pat. No. 4,709,353, published on Nov. 24, 1987, for example.

SUMMARY OF THE INVENTION

It is an object of the present invention to provide a semiconductor memory device capable of preventing an excessive increase in potential on a bit line from exerting an influence on a memory cell.

It is another object of the present invention to provide a semiconductor memory device capable of reliably performing a precharging operation.

In order to achieve the above objects, a semiconductor memory device of a first invention of the present application comprises an internal power supplying circuit electrically connected to an external power supply having an external source potential and for supplying an internal potential lower than the external source potential, a precharging circuit for supplying a half potential of the internal potential to a memory cell and a bit line, and a switching circuit electrically connected between the bit line and the precharging circuit and controlled based on an equalize signal output from a control circuit and having the same potential as the external source potential.

Further, a semiconductor memory device of a second invention of the present application comprises an internal power supplying circuit electrically connected to an external power Supply having an external source potential and for supplying an internal potential lower than the external source potential, a precharging circuit for providing a half potential of the internal potential, a switching circuit electrically connected between a bit line and the precharging circuit, a first conductive line electrically connected between the precharging circuit and the memory cell and a second conductive line electrically connected between the precharging circuit and the switching circuit.

According to such a construction, the semiconductor memory device can be realized wherein even if the potential on the bit line increases excessively, such a potential does not exert an influence on the memory cell.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

FIG. 6 is a partial timing chart for explaining the operation of the semiconductor memory device shown in FIG. I at the time that a power supply thereof has been turned on;

FIG. 10 is a partial timing chart for explaining the operation of the semiconductor memory device shown in FIG. 7 at the time that a power supply thereof has been turned on;

FIG. 12 is a partial timing chart for explaining the operation of the semiconductor memory device shown in FIG. 11 at the time that a power supply thereof has been turned on;

FIG. 14 is a partial timing chart for explaining the operation of the semiconductor memory device shown in FIG. 13 at the time that a power supply thereof has been turned on;

FIG. 17 is a partial timing chart for explaining the operation of the semiconductor memory device shown in FIG. 15 at the time that a power supply thereof has been turned on.

DETAILED DESCRIPTION OF THE PREFERRED EMBODIMENTS

Preferred embodiments of the present invention will hereinafter be described in detail with reference to the accompanying drawings. Each of the present embodiments will be described below using a DRAM having one transistor type memory cells.

Figure 1:
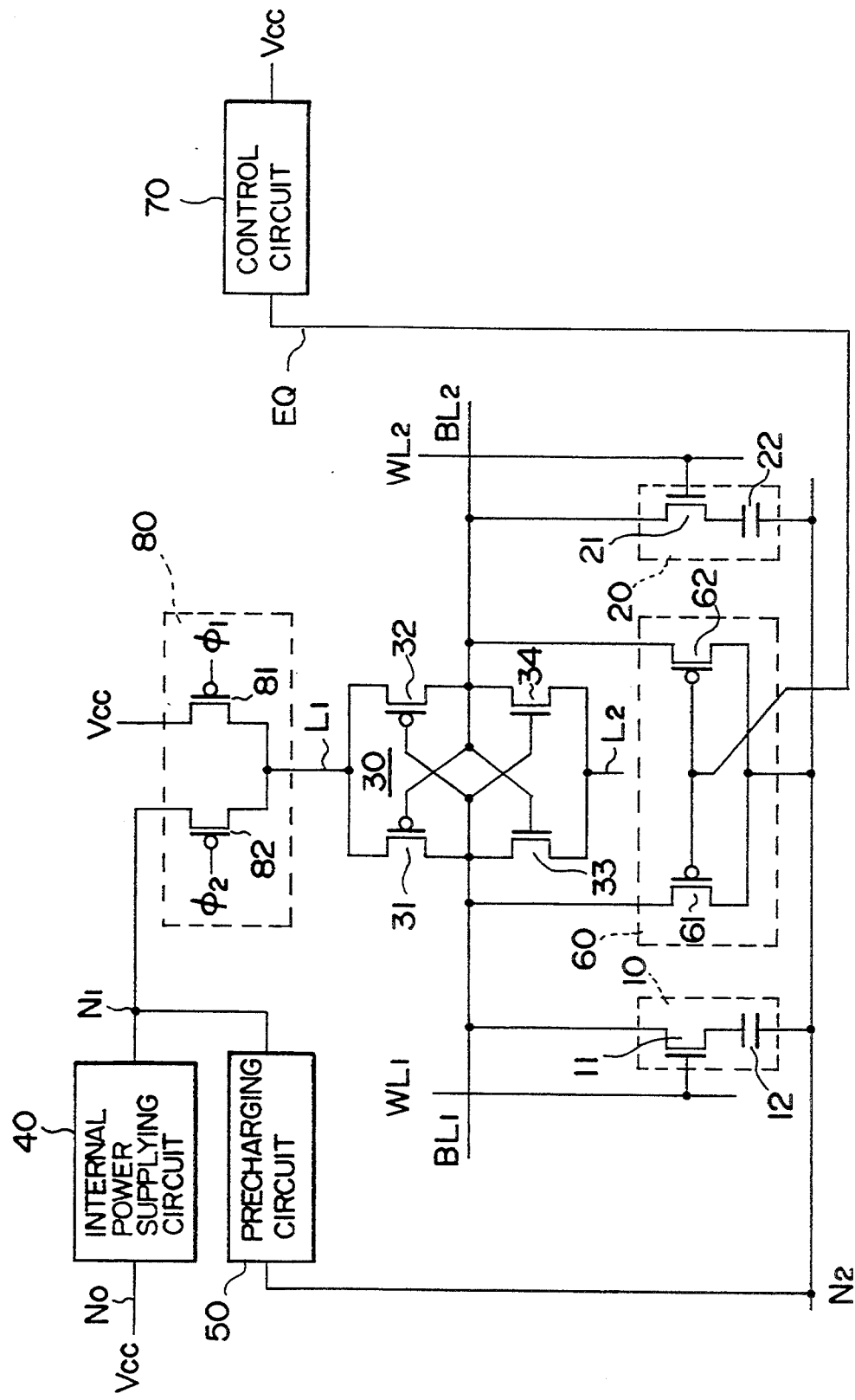
FIG. 1 is a fragmentary block diagram of a semiconductor memory device showing a first embodiment of the present invention.

A first embodiment of the present invention will first be described below with reference to FIG. 1.

A semiconductor memory device (DRAM) according to the present embodiment comprises memory cells 10 and 20 for storing data therein respectively, a pair of bit lines BL1 and BL2 electrically connected to their corresponding memory cells 10 and 20, word lines WL1 and WL2 for providing signals used to select the memory cells respectively, a sense amplifier 30 for amplifying potentials on the bit lines BL1 and BL2, an internal power supplying circuit 40 electrically connected to an external power source or power supply Vcc having an external source or power potential (Vcc level) through a node N0 and for supplying an internal potential V1 (V1 level) corresponding to a level lower than the external power potential (Vcc level) to a node N1, a precharging circuit 50 electrically connected between the node N1 and a node N2 and for supplying a potential V1/2 equal to half the internal potential V1 to the node N2, a switching circuit (second switching circuit) 60 electrically connected between the bit lines BL1 and BL2 and the node N2, a control circuit 70 for controlling the switching circuit 60, and a power supplying circuit (first switching circuit) 80 electrically connected between the sense amplifier 30, the node N1 and the external power supply Vcc.

The memory cell 10 comprises an enhancement type N-channel MOS transistor (hereinafter called an "NMOS") 11 and a capacitor 12. The gate, drain and source electrodes of the NMOS 11 are electrically connected to the word line WL1, the bit line BL1 and the capacitor 12 respectively. The capacitor 12 is electrically connected between the source electrode of the NMOS 11 and the node N2. Similarly, the memory cell 20 is made up of an NMOS 21 and a capacitor 22. The gate, drain and source electrodes of the NMOS 21 are electrically connected to the word line WL2, the bit line BL2 and the capacitor 22 respectively. The capacitor 22 is electrically connected between the source electrode of the NMOS 21 and the node N2.

The sense amplifier 30 comprises enhancement type P-channel MOS transistors (hereinafter called "PMOSs") 31 and 32 and NMOSs 33 and 34. The gate and drain electrodes of the PMOS 31 are electrically connected to the bit line BL2 and the bit line BL1 respectively. Further, the source electrode of the PMOS 31 is electrically connected to the power supplying circuit (second switching circuit) 80 through a latch terminal L1. The gate and drain electrodes of the PMOS 32 are electrically connected to the bit line BL1 and the bit line BL2 respectively. Further, the source electrode of the PMOS 32 is electrically connected to the power supplying circuit (First switching circuit) 80 through the latch terminal L1. The gate, drain and source electrodes of the NMOS 33 are electrically connected to the bit line BL2, the bit line BL1 and a latch terminal L2 respectively. Further, the gate, drain and source electrodes of the NMOS 34 are electrically connected to the bit line BL1, the bit line BL2 and the latch terminal L2 respectively. During a sensing period (corresponding to a period in which the sense amplifier 30 is being activated), the sense amplifier 30 amplifies a difference in potential between the bit lines BL1 and BL2 which are of a complementary bit line pair.

Figure 2:
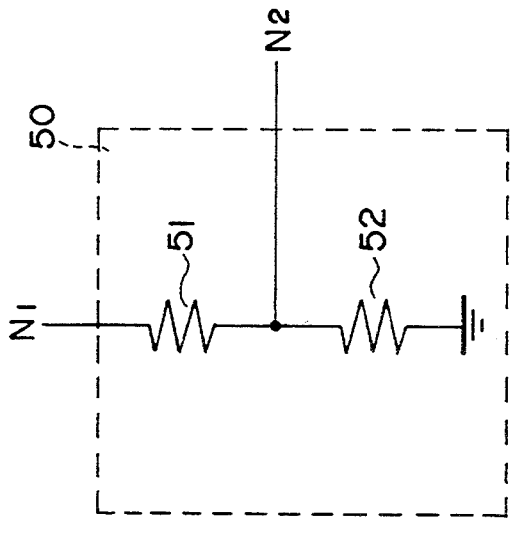
FIG. 2 is a view for describing a specific circuit configuration of an internal power supplying circuit employed in the semiconductor memory device shown in FIG. 1.

The internal power supplying circuit 40 is electrically connected to the external power supply Vcc through the node N0 and supplies the internal potential V1 (V1 level) corresponding to the level lower than the external power potential (Vcc level) to the node N1. As shown in FIG. 2, the internal power supplying circuit 40 is made up of a single NMOS 41. The gate and drain electrodes of the NMOS 41 are electrically connected to the node N0 and the source electrode thereof is electrically connected to the node N1. If the threshold of the NMOS 41 is represented as TV, then the internal potential V1 < of external power potential level Vcc — threshold VT of NMOS 41, i.e., Vcc-VT > is supplied to the node N1. That is, the internal potential V1 corresponds to a potential obtained by causing the external power potential Vcc to drop by the threshold VT.

Figure 3:
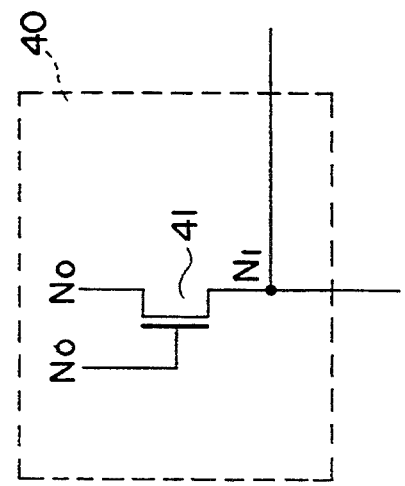
FIG. 3 is a view for describing a specific circuit configuration of a precharging circuit employed in the semiconductor memory device shown in FIG. 1.

The precharging circuit 50 is electrically connected between the node N1 and the node N2 and supplies a potential V1/2 equal to half the internal potential V1 to the node N2. The precharging circuit 50 comprises two resistors 51 and 52 as shown in FIG. 3. The resistors 51 and 52 are electrically series-connected between the node N1 and a ground power supply Vss having a ground potential (Vss level). A node between the resistors 51 and 52 is electrically connected to the node N2. The precharging circuit 50 makes a fixed fraction of the internal potential V1 using the resistors 51 and 52 and supplies the half potential V1/2 of the internal potential V1 to the node N2.

The switching circuit (second switching circuit) 60 is made up of PMOSs 61 and 62. The gate electrode of the PMOS 61 is electrically connected to the control circuit 70 so as to receive an equalize signal EQ from the control circuit 70. The drain electrode of the PMOS 61 is electrically connected to the node N2 and the source electrode of the PMOS 61 is electrically connected to the bit line BL1. Similarly, the gate electrode of the PMOS 62 is electrically connected to the control circuit 70 so as to receive the equalize signal EEQ from the control circuit 70. The drain electrode of the PMOS 62 is electrically connected to the node N2 and the source electrode thereof is electrically connected to the bit line BL2. The switching circuit 60 is turned ON in response to the equalize signal EQ sent from the control circuit 70 during a precharging period prior to the sensing period of the sense amplifier 30. Further, the potentials, which appear on the bit line pair BL1 and BL2, are respectively precharged to the potential V1/2 supplied from the precharging circuit 50. The switching circuit 60 is turned OFF during the sensing period.

Figure 4:
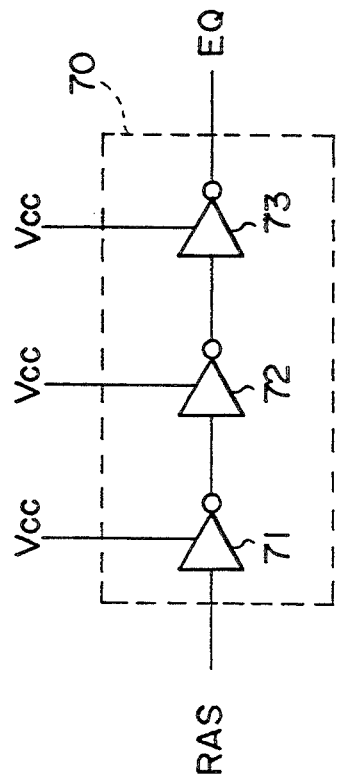
FIG. 4 is a view for describing a specific circuit configuration of a control circuit employed in the semiconductor memory device shown in FIG. 1.

The control circuit 70 is electrically connected between the external power supply Vcc and the switching circuit (second switching circuit) 60 and outputs the equalize signal EQ to the switching circuit (second switching circuit) 60. The equalize signal EQ has the same potential as the external power potential (Vcc level). The control circuit 70 is made up of CMOS type inverters 71, 72 and 73 electrically series-connected to each other in the form of three stages as shown in FIG. 4. The input of the inverter 71 is supplied with a row address strobe signal (hereinafter called a "RAS". The control circuit 70 outputs the equalize signal EQ out of phase with the RAS and having the same potential as the external power potential (Vcc level) therefrom in response to the RAS.

The power supplying circuit (first switching circuit) 80 comprises a PMOS 81 and a PMOS 82. The gate electrode of the PMOS 81 is supplied with a control signal ∅1. Further, the drain and source electrodes of the PMOS 81 are electrically connected to the external power supply Vcc and the latch terminal L1 respectively. The gate electrode of the PMOS 82 is supplied with a control signal ∅2. Further, the drain and source electrodes of the PMOS 82 are electrically connected to the node N1 and the latch terminal L1.

Figure 5:
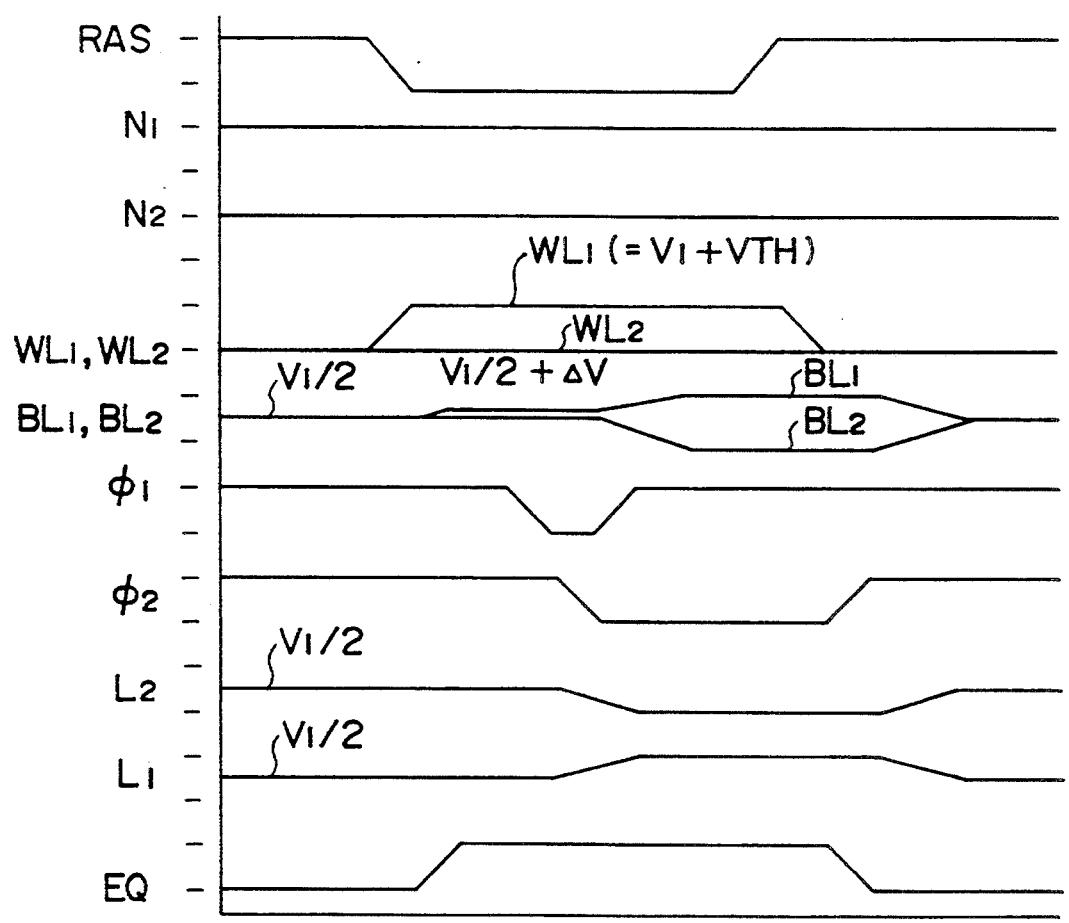
FIG. 5 is a partial timing chart for explaining the operation of the semiconductor memory device illustrated in FIG. 1.

The operation of the semiconductor memory device will next be described below with reference to a timing chart shown in FIG. 5. This description is made with respect to each of the precharging period (reset period), an operating period and a re-precharging period (re-reset period). The operation of the semiconductor memory device is carried out based on the RAS.

(a) Precharging period (reset period)

When the RAS is of a high level (hereinafter abbreviated as an "H"), the equalize signal EQ output from the control circuit 70 has a ground potential level (hereinafter called a "Vss level"). The PMOSs 61 and 62 are turned ON in response to the equalize signal EQ so that each of the potentials on the bit line pair BL1 and BL2 is equal to the potential V1/2 at or of the node N2. Since, at this time, each of the control signals ∅1 and ∅2 has the same potential as the internal potential V1, each of the PMOSs 81 and 82 is turned OFF. Each of the latch terminals L1 and L2 is set to a potential identical to the potential V1/2 of the node N2 by a latch circuit (not shown). Since, in this case, each of the bit line pair BL1 and BL2 and each of the latch terminals L1 and L2 are of the V1/2 level in potential, the PMOSs 31 and 32 and the NMOSs 33 and 34 are turned OFF. Thus, the sense amplifier 30 is brought into an inactivated state. Since, at this time, each of the word lines WL1 and WL2 is of the Vss level in potential, the NMOSs 11 and 21 disposed in the memory cells 10 and 20 are respectively turned OFF.

(b) Operating period

When the RAS is brought to a low level (hereinafter abbreviated as an "L"), the semiconductor memory device is brought into an operating state. In this case, a description will be made of an operation for selecting the word line WL1, for example and reading data from the memory cell 10 by an address decoder (not shown). When the word line WL1 is selected, it is activated so that the potential at or of the word line WL1 is brought to a V1+VTH. The term "VTH" represents a threshold voltage of the NMOS 11.

When the RAS is first brought to the "L" and the word line WL 1 is brought into an activated state, the potential of the equalize signal EQ is changed from the Vss level to the Vcc level. Further, the PMOSs 61 and 62 are turned OFF. Since the NMOS 11 is turned ON when the word line WL1 is activated, the bit line BL1 is electrically connected to the capacitor 12 through the NMOS 11. As a result, the potential of the bit line BL1 is increased by ΔV from the V1/2 so as to be brought to V1/2+ΔV. On the other hand, the potential of the bit line BL2 remains at the precharged potential V1/2.

When a one-shot pulse ("H"→"L"→"H") of the control signal ∅1 is produced, the PMOS 81 is turned ON. Thus, the external power supply Vcc and the latch terminal L1 are held in conduction so that the potential at the latch terminal L1 is changed from V1/2 to V1. At the same time, the potential at the latch terminal L2 is changed from V1/2 to Vss. After the one-shot pulse of the control signal ∅1 has been produced, the PMOS 81 is turned OFF. Further, when the potential of the control signal e2 is changed from the V1 level to the Vss level, the PMOS 82 is turned ON. Thus, the node N1 and the latch terminal L1 are brought into a conducting state so that the potential at the latch terminal L1 is stably held at the V1 level.

Thus, the combined use of the internal power supply and the external power supply can bring about the following advantages. That is, since a load with respect to the ability of supplying current through the node N1, i.e., a load produced due to the parasitic capacitance of the latch terminal L1 is reduced, noise produced at the node N1 is restrained or controlled.

When the potentials at the latch terminals L1 and L2 are changed as described above, the PMOSs 31 and 32 and the NMOSs 33 and 34 are activated, that is, the sense amplifier 30 is activated to perform a sense amplifying operation. Thereafter, the potential of the bit line BL 1 is brought to the V1 level. At the same time, the potential of the bit line BL2 is maintained at the Vss level. Thus, the sense amplifying operation is completed. Since the word line WL1 is at the V1+VTH level in this case, the bit line BL1 and the capacitor 12 are held in conduction through the NMOS 11 in the memory cell 10 which operates at a triode region. Accordingly, the capacitor 12 is charged to the V1 level identical to the potential of the bit line BL1. As a result, the potential V1, which has first been held by the memory cell 10, is written into the memory cell 10 again.

When the RAS is brought to the "H" again, the semiconductor memory device is brought into state at the above resetting (a).

Figure 6:
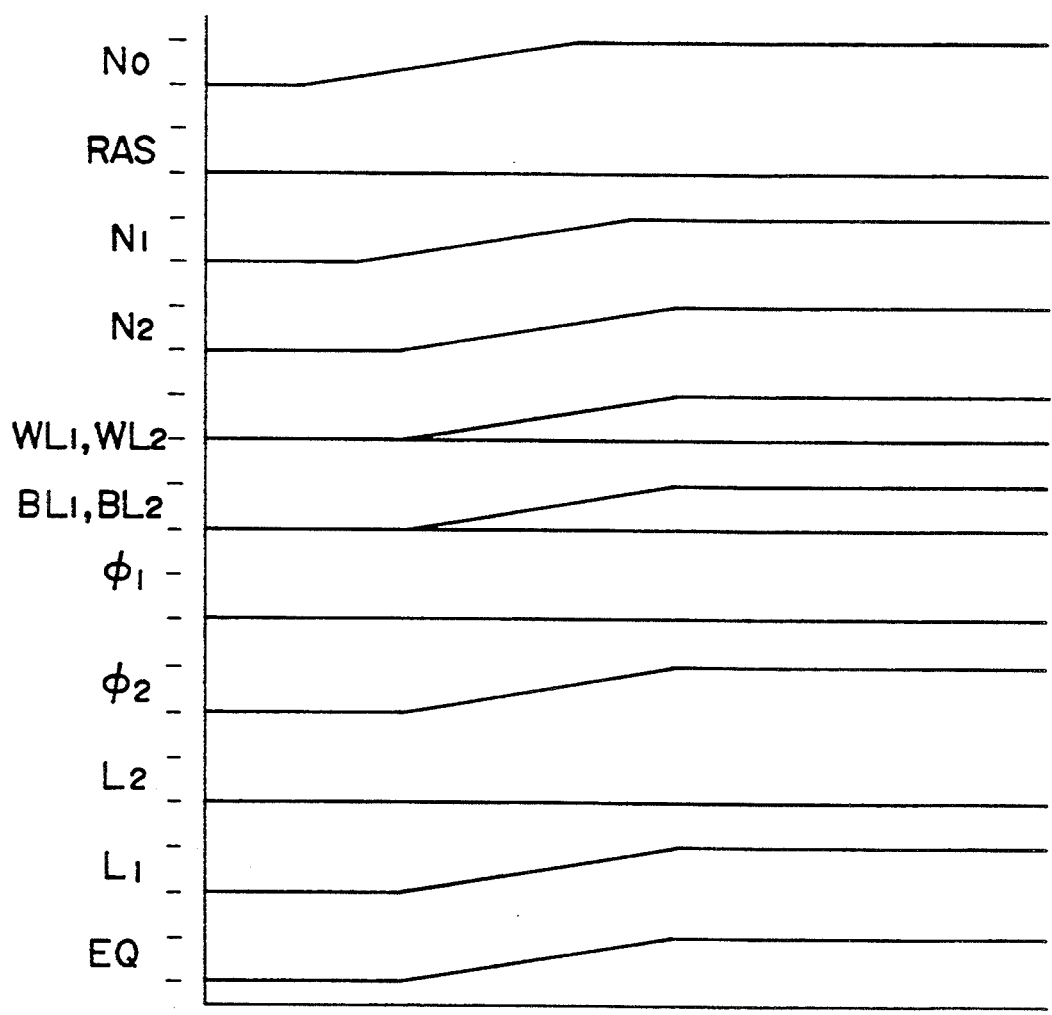

The operation of the semiconductor memory device shown in FIG. 1 at the time that the power supply has been turned on, will next be described with reference to a timing chart shown in FIG. 6. FIG. 6 shows the operation of the semiconductor memory device at the time that the RAS is of the "L" upon turning on the power supply.

When the power supply is turned on, the potential at the node N0 is changed from the ground potential level (Vss level) to the external power potential level (Vcc level). Owing to its transition, the internal power supplying circuit 40 supplies the internal potential V1 to the node N1. Further, the precharging circuit 50 supplies the potential V1/2 equal to half the V1 level to the node N2 in response to a variation in potential at the node N1.

Since the subsequent operation can be easily understood by reference to the description of the operating period (b), and its description will therefore be omitted.

When the latch terminal L1 is supplied with a potential (i.e., when it is charged), the PMOS 81 is first turned ON in response to the one-shot pulse of the control signal ∅1 as described above and the potential of the control signal ∅2 is then changed to the Vss level, so that a PMOS 82 is turned ON. Further, the potential at the latch terminal L1 is stably maintained at the V1 level. Such an operation is controlled at timings of the control signals ∅1 and ∅2.

However, if "variations" occur in the generation of the control signals upon turning on the power supply and the potentials of the control signals ∅1 and ∅2 are fixed to the Vss level and the V1 level respectively, then the PMOS 81 is held ON. As a result, the potential at the latch terminal L1 is raised to the external power potential level (Vcc level) larger than the internal power potential level (V1 level). Thus, the potential of either one of the bit lines BL1 and BL2, which is electrically connected to the latch terminal L1 through either the PMOS 31 or the PMOS 32 held in an activated state, is brought to the Vcc level. If, at this time, the difference between the potential (Vcc level) of either the bit line BL1 or the bit line BL2 and the potential of the equalize signal EQ is greater than the threshold voltage of each of the PMOSs 61 and 62 of the switching circuit (second switching circuit) 60, then either the PMOS 61 or the PMOS 62 is turned ON. As a result, each of the capacitors 12 and 22 of the memory cells 10 and 20 is supplied with an excessive potential. However, the equalize signal EQ output from the control circuit 70 of the semiconductor memory device according to the present invention has the same potential (level) as the external power potential (Vcc level). Accordingly, the difference between the potential (Vcc level) of either the bit line BL1 or the bit line BL2 and the potential of the equalize signal EQ becomes smaller than the threshold voltage of each of the PMOSs 61 and 62 of the switching circuit (second switching circuit) 60. Thus, even if the above "variations" occur, either the PMOS 61 or the PMOS 62 is reliably turned OFF.

According to the semiconductor memory device of the present invention as described above, since the switching circuit (second switching circuit) 60 is reliably controlled even if the variations occur in the control signals, the excessive potential is no longer applied to each of the memory cells.

Figure 7:
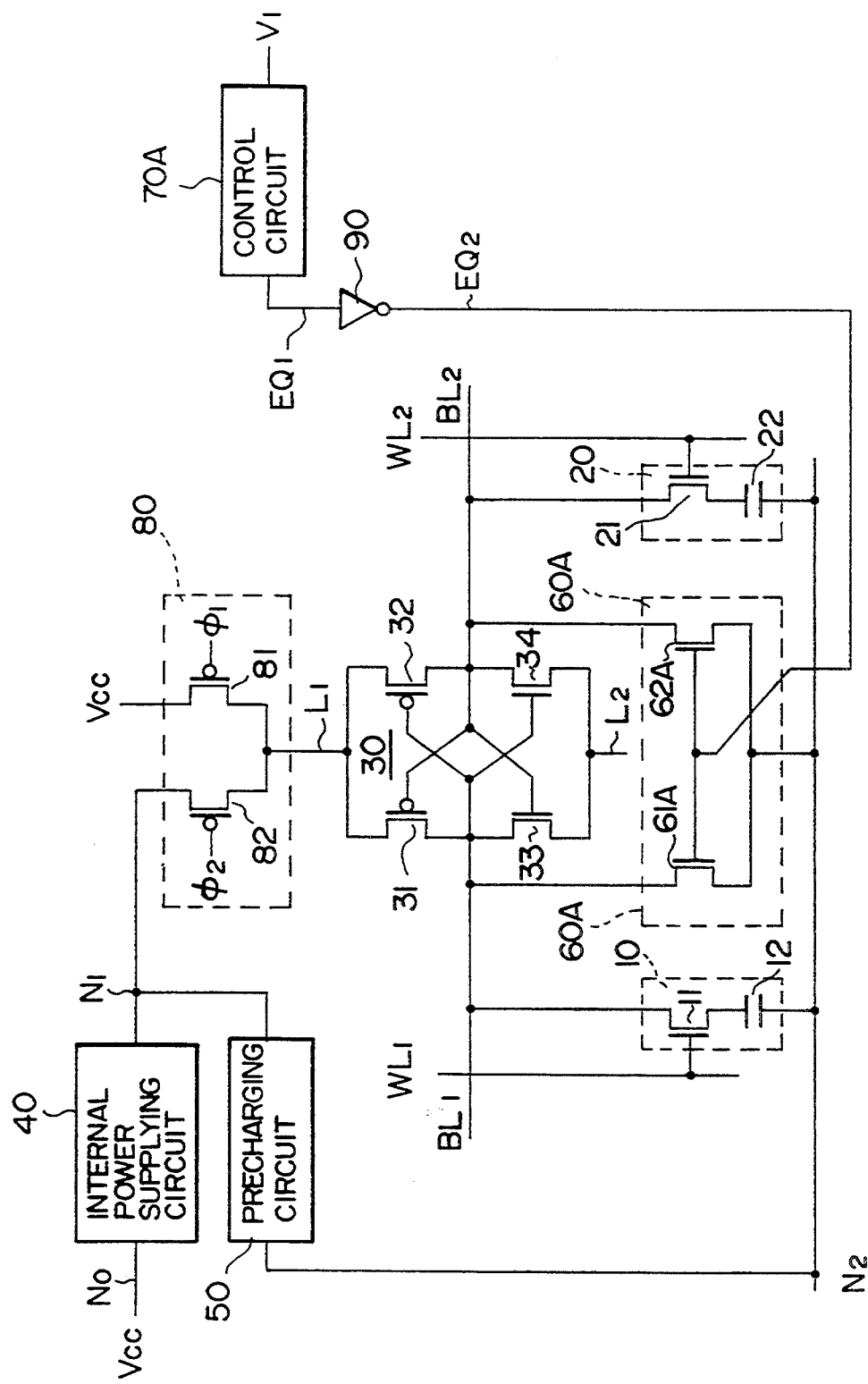
FIG. 7 is a fragmentary block diagram of a semiconductor memory device showing a second embodiment of the present invention.

A second embodiment of the present invention will next be described with reference to FIG. 7. In this case, the same elements of structure as those employed in the semiconductor memory device according to the first embodiment of the present invention are identified by like reference numerals, and their description will therefore be omitted. The description omitted herein can be easily understood by reference to the description made in the aforementioned embodiment.

The following elements employed in the semiconductor memory device according to the second embodiment of the present invention are different from those employed in the semiconductor memory device (shown in FIG. 1) according to the first embodiment. That is, the switching circuit (second switching circuit) 60 is replaced by a switching circuit (second switching circuit) 60A and the control circuit 70 is replaced by a control circuit 70A and an inverter 90.

Figure 8:
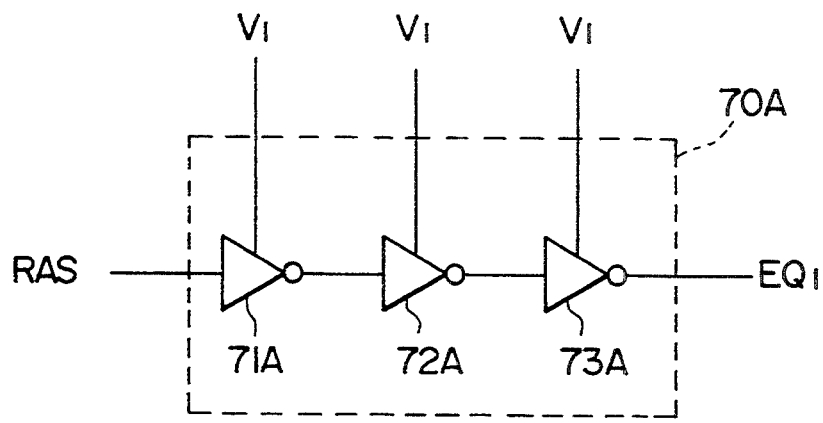
FIG. 8 is a view for describing a specific circuit configuration of a control circuit employed in the semiconductor memory device shown in FIG. 7.
Figure 9:
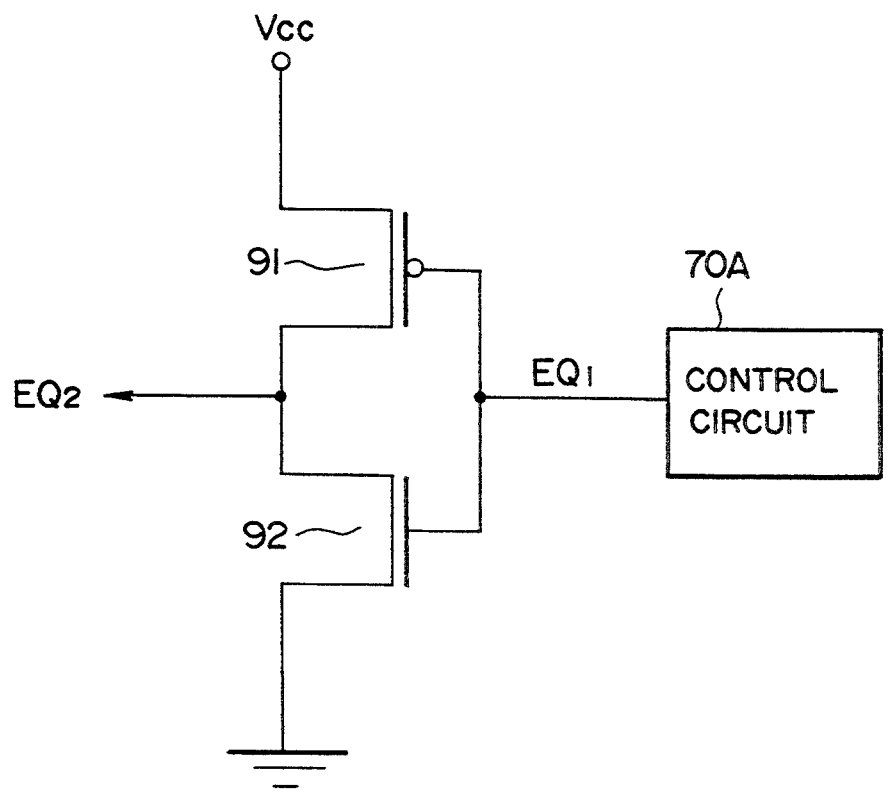
FIG. 9 is a view for describing a specific circuit configuration of an inverter employed in the semiconductor memory device shown in FIG. 7.

The control circuit 70A receives an internal potential V1 therein and outputs an equalize signal EQ1 having a potential V1 to a CMOS type inverter 90 during a precharging period. The equalize signal EQ1 has the same potential as the internal potential V1 (V1 level). The control circuit 70A is made up of CMOS type inverters 71A, 72A and 73A electrically series-connected to each other in the form of three stages as shown in FIG. 8. The input of the inverter 71A is supplied with a RAS (not shown). The control circuit 70A outputs the equalize signal EQ1 out of phase with the RAS and having the same potential as the internal potential V1 (V1 level) therefrom in response to the RAS. The inverter 90 inverts a logical level of the equalize signal EQ1 and outputs an equalize signal EQ2 to the switching circuit (second switching circuit) 60A. The inverter 90 is made up of a PMOS 91 and an NMOS 92 as shown in FIG. 9. The PMOS 91 and the NMOS 92 are electrically series-connected between an external power supply Vcc and a ground power supply Vss.

The switching circuit (second switching circuit) 60A is made up of NMOSs 61A and 62A. The gate, source and drain electrodes of the NMOS 61A are electrically connected to the output of the inverter 90, a bit line BL1 and a node N2 respectively. The gate, source and drain electrodes of the NMOS 62A are electrically connected to the output of the inverter 90, a bit line BL2 and the node N2 respectively.

The operation of the semiconductor memory device according to the second embodiment will be easily understood from the description about the operation of the semiconductor memory device according to the first embodiment.

Figure 10:
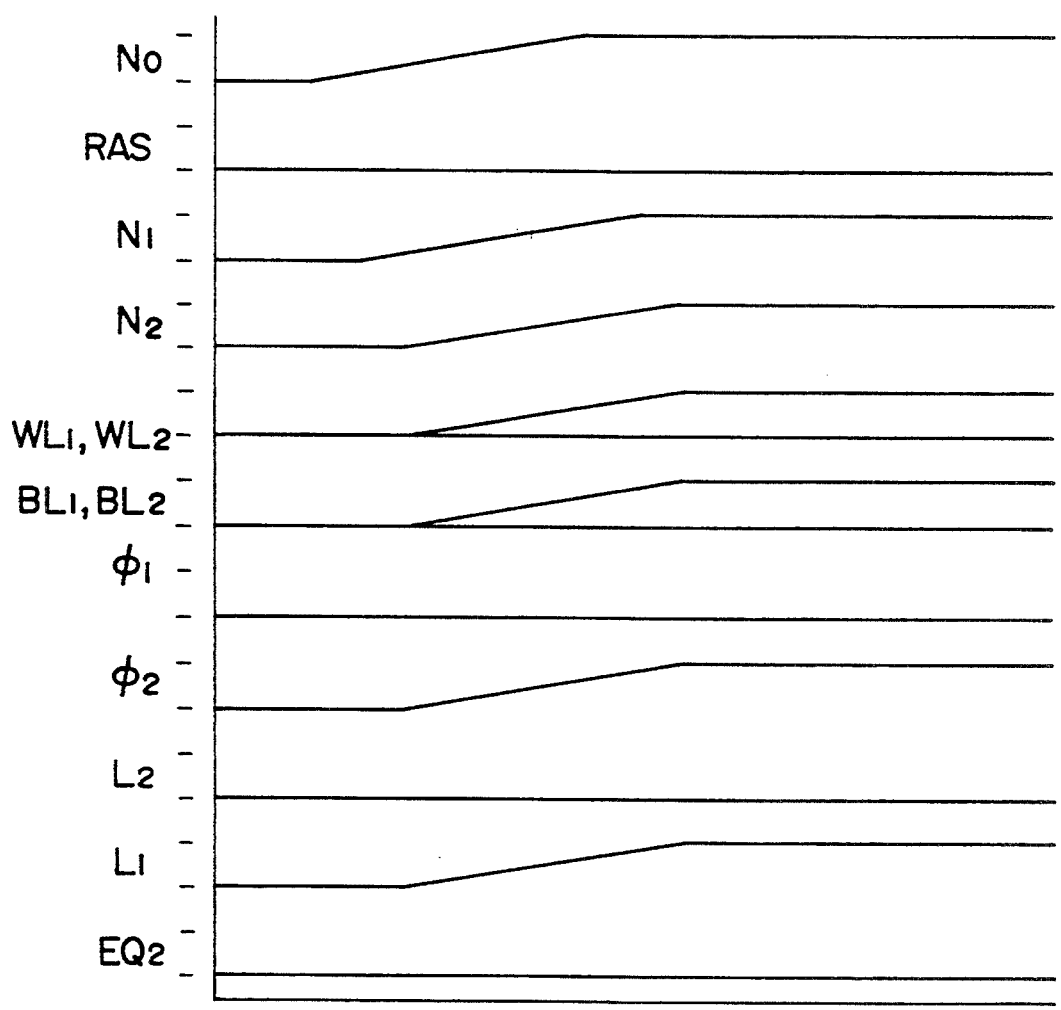

The operation of the semiconductor memory device shown in FIG. 4 at the time that the power supply thereof has been turned on, will next be described with reference to a timing chart shown in FIG. 10. FIG. 10 shows the operation of the semiconductor memory device at the time that the RAS is of an "L" upon turning on the power supply.

When the power supply is turned on, the potential at or of a node N0 is changed from a ground potential level (Vss level) to an external power potential level (Vcc level). Owing to its transition, an internal power supplying circuit 40 supplies the internal potential V1 to a node N1. Further, a precharging circuit 50 supplies a potential V1/2 equal to half the V1 level to the node N2 in response to a variation in potential of the node N1.

Since the subsequent operation can be easily understood by reference to the description of the aforementioned operating period (b), and its description will therefore be omitted.

When a latch terminal L1 is supplied with a potential (i.e., when it is charged), a PMOS 81 is first turned ON in response to a one-shot pulse of a control signal ∅1 as described above and the potential of a control signal ∅2 is then changed to the Vss level, so that a PMOS 82 is turned ON. Further, the potential at the latch terminal L1 is stably maintained at the V1 level. Such an operation is controlled at timings of the control signals ∅1 and ∅2.

However, if "variations" occur in the generation of the control signals upon turning on the power supply and the potentials of the control signals ∅1 and ∅2 are fixed to the Vss level and the V1 level respectively, then the PMOS 81 is held ON. As a result, the potential at the latch terminal L1 is raised to the external power potential level (Vcc level) larger than the internal power potential level (V1 level). Thus, the potential at either one of the bit lines BL1 and BL2, which is electrically connected to the latch terminal L1 through either a PMOS 31 or a PMOS 32 held in an activated state, is brought to the Vcc level. At this time, the NMOS 61A and the NMOS 62A are turned ON based on the relationship between the threshold voltage of each of the NMOSs 61A and 62A, the potential (Vcc level) of either the bit line BL1 or the bit line BL2 and the potential of the equalize signal EQ. As a result, each of capacitors 12 and 22 of memory cells 10 and 20 is supplied with an excessive potential. However, the equalize signal EQ2 supplied to the switching circuit (second switching circuit) 60A of the semiconductor memory device according to the present invention has the same potential (level) as the ground potential Vss (Vss level) (or power potential level (Vcc level)). Thus, even if the above "variations" occur, either the NMOS 61A or the NMOS 62A is reliably turned OFF.

According to the semiconductor memory device of the present invention as described above, since the switching circuit (second switching circuit) 60 is reliably controlled even if the variations occur in the control signals, the excessive potential is no longer applied to each of the memory cells.

Further, since either the internal power supply or the external power supply can be selected on the periphery of each memory cell very strict in design standard (narrow in space and low in the degree of freedom of design) by reference to the construction of the second embodiment as well as that of the first embodiment, the flexibility is considered to be improved upon design of layout or arrangement of power conductive lines or wires.

Figure 11:
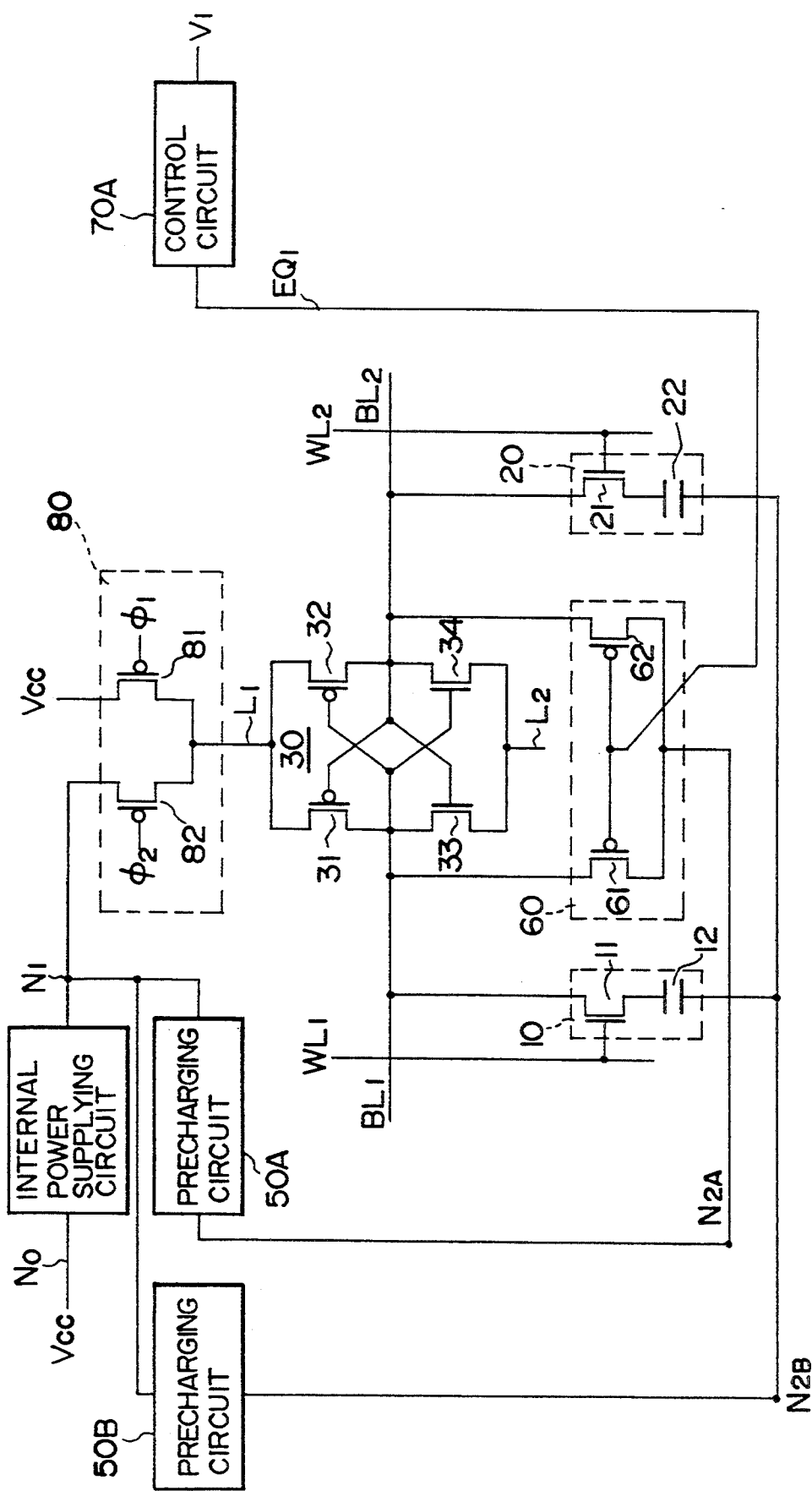
FIG. 11 is a fragmentary block diagram of a semiconductor memory device showing a third embodiment of the present invention.

A third embodiment of the present invention will next be described below with reference to FIG. 11. The same elements of structure as those employed in the semiconductor memory device shown in FIG. 1 according to the first embodiment of the present invention and the semiconductor memory device shown in FIG. 7 according to the second embodiment of the present invention are identified by like reference numerals, and their description will therefore be omitted. The description omitted herein can be easily understood by reference to the description of each of the first and second embodiments.

The following elements employed in the semiconductor memory device according to the third embodiment of the present invention are different from those employed in the semiconductor memory devices (shown in FIGS. 1 and 7) according to the first and second embodiment.

That is, two precharging circuits 50A and 50B are electrically connected to a node N1. Each of the precharging circuits 50A and 50B supplies a half potential V1/2 of an internal potential V1 to each of nodes N2A and N2B. The node N2A is electrically connected to a switching circuit (second switching circuit) 60. The node N2B is electrically connected to memory cells 10 and 20.

Each of the precharging circuits 50A and 50B is identical in structure to that of the precharging circuit shown in FIG. 3.

Figure 12:
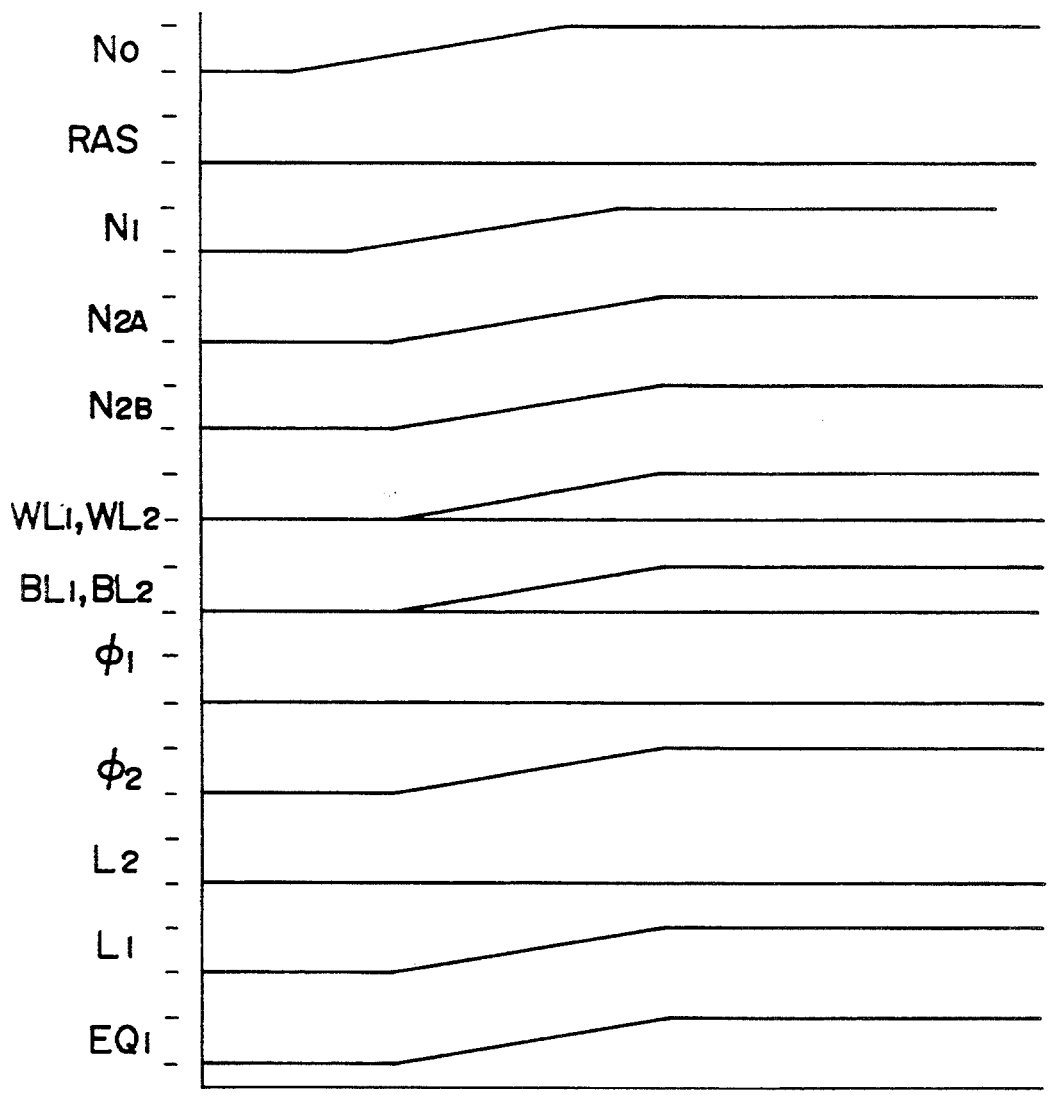

The operation of the semiconductor memory device shown in FIG. 11 at, the time that a power supply thereof has been turned on, will next be described with reference to a timing chart shown in FIG. 12. FIG. 12 shows the operation of the semiconductor memory device at the time that a RAS is of an "L" upon turning on the power supply.

When the power supply is turned on, the potential at a node N0 is changed from a ground potential level (Vss level) to an external power potential level (Vcc level). Owing to its transition, an internal power supplying circuit 40 supplies the internal potential V1 to the node N1. Further, each of the precharging circuits 50A and 50B supplies the potential V1/2 equal to half the V 1 level to each of the nodes N2A and N2B in response to a variation in potential at the node N1.

Since the subsequent operation can be easily understood by reference to the description of the operating period (b) shown in the first embodiment, and its description will therefore be omitted.

When a latch terminal L1 is supplied with a potential (i.e., when it is charged), a PMOS 81 is first turned ON in response to a one-shot pulse of a control signal ∅1 as described above and the potential of a control signal ∅2 is then changed to the Vss level, so that a PMOS 82 is turned ON. Further, the potential at the latch terminal L1 is stably maintained at the V1 level. Such an operation is controlled at timings of the control signals ∅1 and ∅2.

However, if "variations" occur in the generation of the control signals upon turning on the power supply and the potentials of the control signals ∅1 and ∅2 are fixed to the Vss level and the V1 level respectively, then the PMOS 81 is held ON. As a result, the potential at the latch terminal L1 is raised to the external power potential level (Vcc level) larger than the internal power potential level (V1 level). Thus, the potential of either one of bit lines BL1 and BL2, which is electrically connected to the latch terminal L1 through either a PMOS 31 or a PMOS 32 held in an activated state, is brought to the Vcc level. If, at this time, the difference between the potential (Vcc level) of either the bit line BL1 or the bit line BL2 and the potential of the equalize signal EQ is greater than the threshold voltage of each of PMOSs 61 and 62, then either the PMOS 61 or the PMOS 62 is turned ON.

Further, since a system (system of the node N2D) for supplying the half potential V1/2 of the internal potential to each of the memory cells 10 and 20 and a system (system of the node N2C) for supplying the potential V1/2 to the first switching circuit 60 are separated from each other in the semiconductor memory device according to the present embodiment even if the above result is brought about, an excessive potential is not supplied to each of the memory cells.

Figure 13:
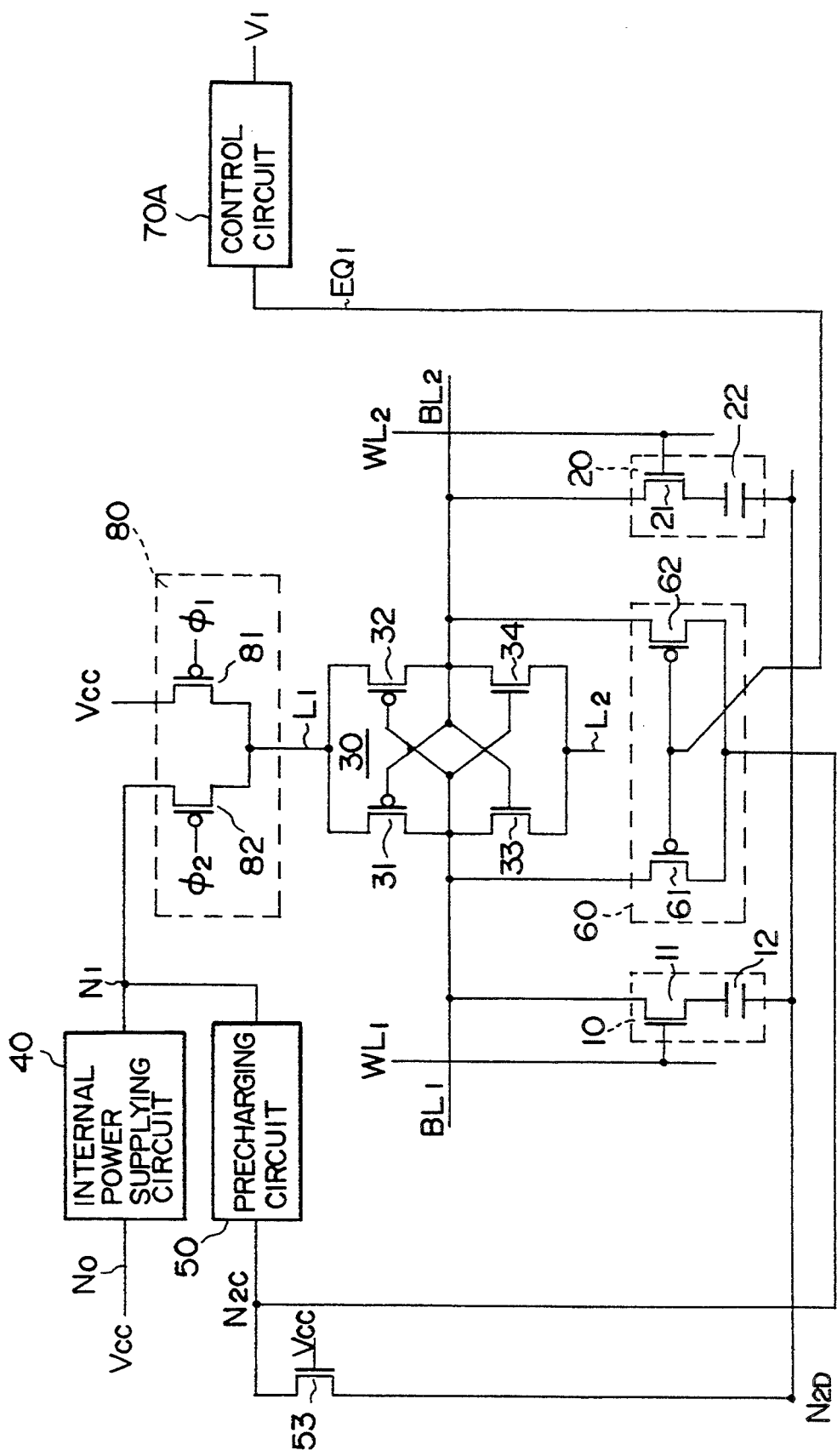
FIG. 13 is a fragmentary block diagram of a semiconductor memory device showing a fourth embodiment of the present invention.

A fourth embodiment of the present invention will be described with reference to FIG. 13. In this case, the same elements of structure as those of the semiconductor memory devices according to the first, second and third embodiments of the present invention are identified by the same reference numerals, and their description will therefore be omitted. The description omitted herein can be easily understood by reference to the description made in each of the first, second and third embodiments.

The following elements employed in the semiconductor memory device according to the fourth embodiment of the present invention differs from those employed in the semiconductor memory devices (shown in FIGS. 1,7 and 11) according to the first, second and third embodiments.

That is, a precharging circuit 50 supplies a half potential V 1/2 of an internal potential V1 to a node N2C. The node N2C is electrically connected to a switching circuit (second switching circuit) 60. Further, the node N2C is electrically connected to a node N2D through an NMOS 53. The node N2D is electrically connected to each of capacitors 12 and 22 of memory cells 10 and 20. That is, the memory cells 10 and 20 and the switching circuit (second switching circuit) 60 are respectively independent systems and are electrically parallel-connected to the node N2C. The gate, drain and source electrodes of the NMOS 53 are electrically connected to an external power supply, the node N2C and the node N2D respectively. The potential V1/2 is supplied to each of the memory cells 10 and 20 through the NMOS 53 held in an ON state.

Figure 14:
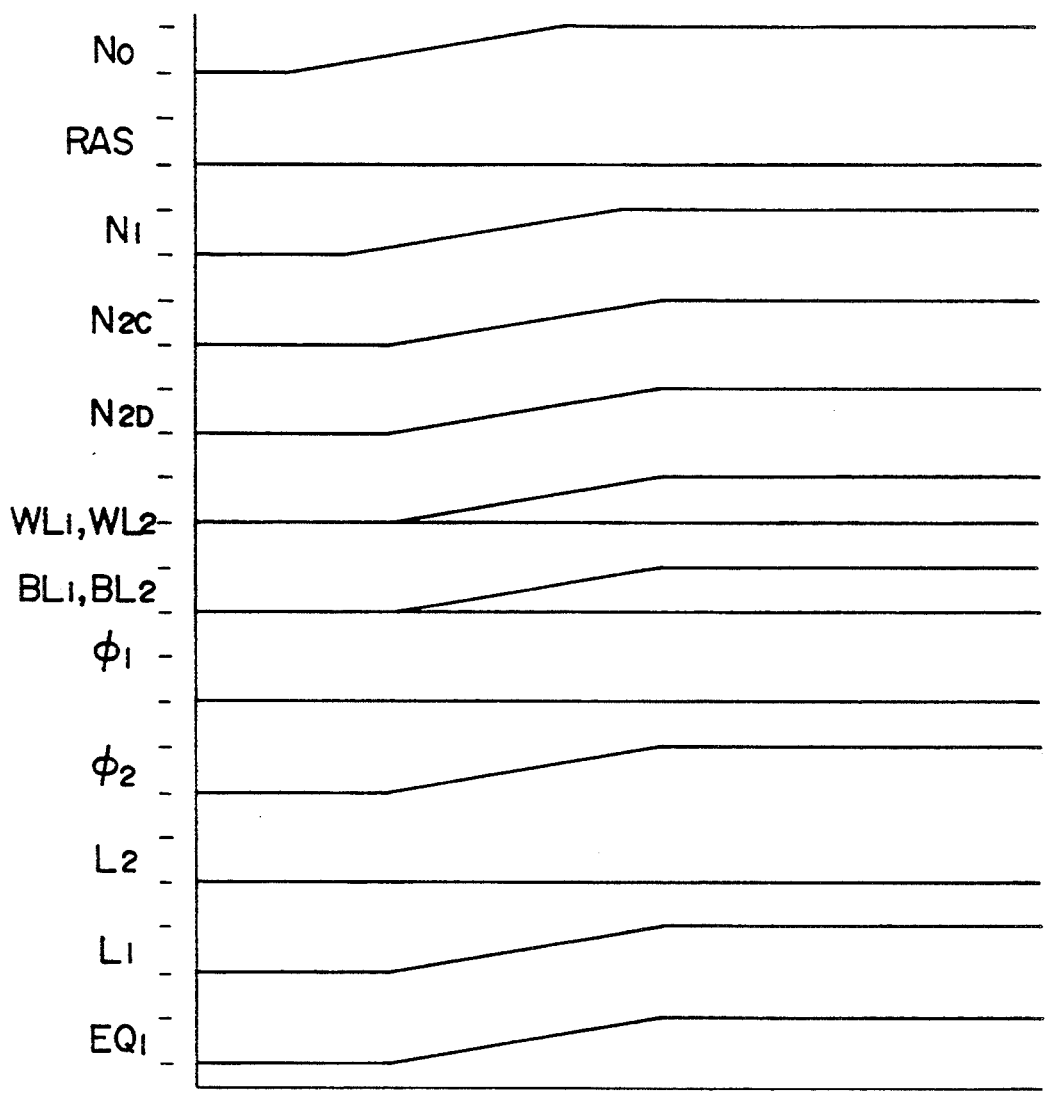

The operation of the semiconductor memory device shown in FIG. 13 at the time that a power supply thereof has been turned on, will next be described with reference to a timing chart shown in FIG. 14. FIG. 14 shows the operation of the semiconductor memory device at the time that a RAS is of an "L" upon turning on the power supply.

When the power supply is turned on, the potential of a node N0 is changed from a ground potential level (Vss level) to an external power potential level (Vcc level). Owing to its transition, an internal power supplying circuit 40 supplies the internal potential V1 to a node N1. Further, the precharging circuit 50 supplies the potential V1/2 equal to half the V1 level to the node N2C in response to a variation in potential at the node N1.

Since the subsequent operation can be easily understood by reference to the description of the operating period (b) shown in the first embodiment, and its description will therefore be omitted.

When a latch terminal L1 is supplied with a potential (i.e., when it is charged), a PMOS 81 is first turned ON in response to a one-shot pulse of a control signal ∅1 as described above and the potential of a control signal ∅2 is then changed to the Vss level, so that a PMOS 82 is turned ON. Further, the potential at the latch terminal L1 is stably maintained at the V1 level. Such an operation is controlled at timings of the control signals ∅1 and ∅2.

However, if "variations" occur in the generation of the control signals upon turning on the power supply and the potentials of the control signals ∅1 and ∅2 are fixed to the Vss level and the V1 level respectively, then the PMOS 81 is held ON. As a result, the potential at the latch terminal L1 is raised to the external power potential level (Vcc level) larger than the internal power potential level (V1 level). Thus, the potential of either one of bit lines BL1 and BL2, which is electrically connected to the latch terminal L1 through either a PMOS 31 or a PMOS 32 held in an activated state, is brought to the Vcc level. If, at this time, the difference between the potential (Vcc level) of either the bit line BL1 or the bit line BL2 and the potential of an equalize signal EQ is greater than the threshold voltage of each of PMOSs 61 and 62 of the switching circuit (second switching circuit) 60, then either the PMOS 61 or the PMOS 62 is turned ON.

Further, since a system (system of a node N2B) for supplying the half potential V1/2 of the internal potential to each of the memory cells 10 and 20 and a system (system of a node N2A) for supplying the potential V1/2 to the switching circuit (second switching circuit) 60 are separated from each other in the semiconductor memory device according to the present embodiment even if the above result is brought about, an excessive potential is not supplied to each of the memory cells. Even if the potential of the node N2C is brought to the Vcc level, only a potential (Vcc-VT) reduced by a threshold voltage (VT) of the NMOS 53 is applied to the node N2D by the NMOS 53. Accordingly, an excessive potential is no longer supplied to each of the capacitors of the memory cells.

Figure 15:
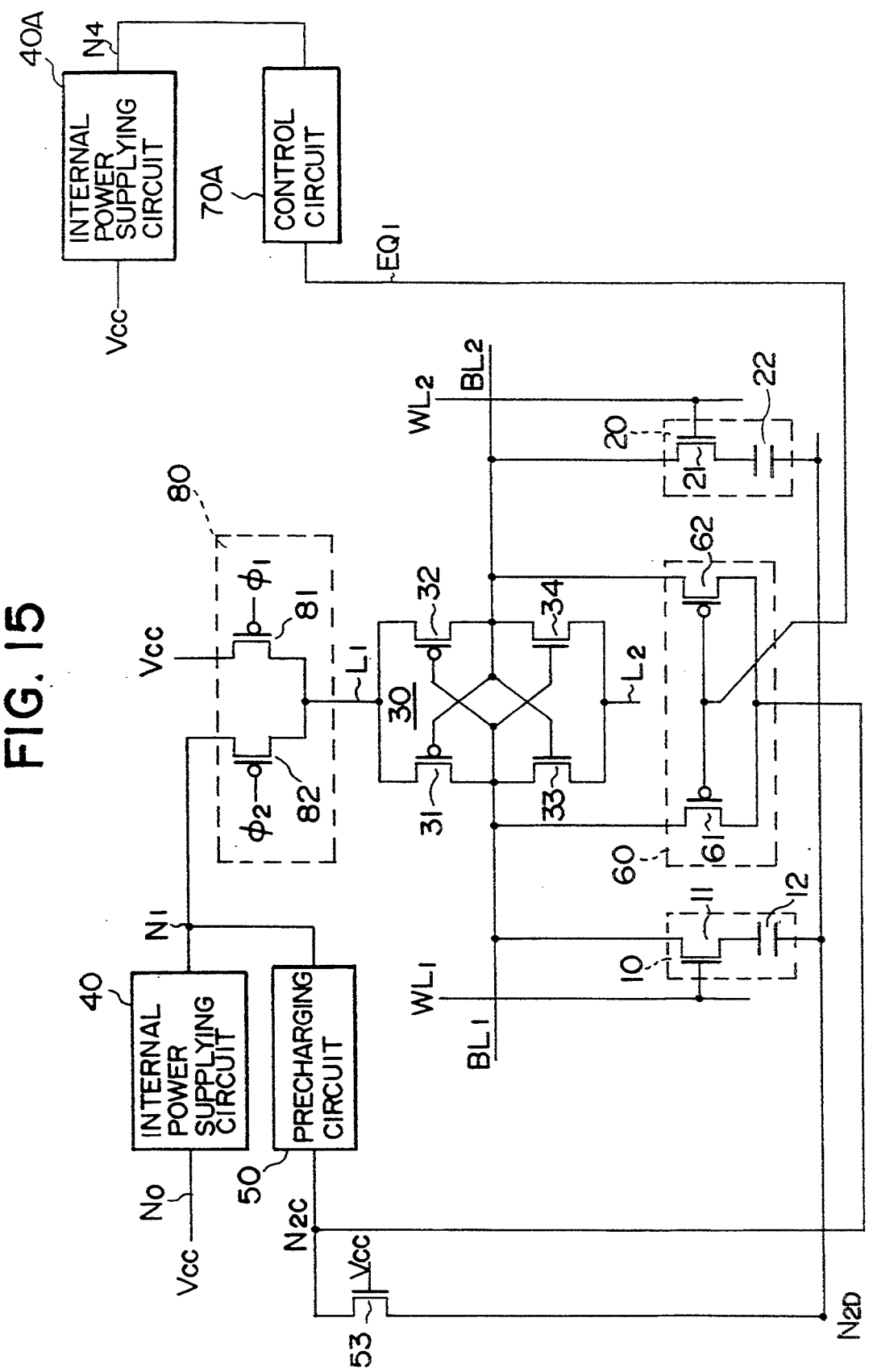
FIG. 15 is a fragmentary block diagram of a semiconductor memory device showing a fifth embodiment of the present invention.

A fifth embodiment of the present invention will next be described with reference to FIG. 15. In this case, the same elements of structure as those employed in the semiconductor memory devices according to the first, second, third and fourth embodiments of the present invention are identified by like reference numerals, and their description will therefore be omitted. The description omitted herein can be easily understood by reference to the description made in the first, second, third and fourth embodiments.

The following elements employed in the semiconductor memory device according to the fifth embodiment of the present invention are different from those employed in the semiconductor memory devices (shown in FIGS. 1,7,11 and 13) according to the first, second, third and fourth embodiments of the present invention.

Figure 16:
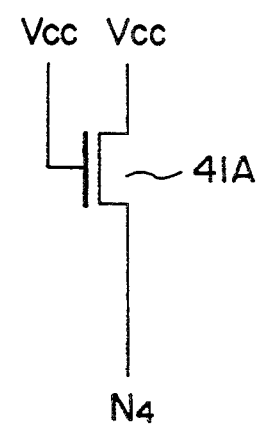
FIG. 16 is a view for describing a specific circuit configuration of an internal power supplying circuit employed in the semiconductor memory device shown in FIG. 15.

In the present embodiment, an internal power supplying circuit 40A is electrically connected to the control circuit 70A of the semiconductor memory device (shown in FIG. 13) according to the fourth embodiment. The internal power supplying circuit 40A is electrically connected to an external power supply Vcc and supplies an internal potential V2 to a node N4. The internal potential V2 stands in the relationship given by the following expression, i.e., Vcc>V2>V1. The internal power supplying circuit 40A is made up of a single NMOS 41A as shown in FIG. 16. The gate and drain electrodes of the NMOS 41A are electrically connected to the external power supply Vcc and the source of the NMOS 41A is electrically connected to the node N4.

Figure 17:
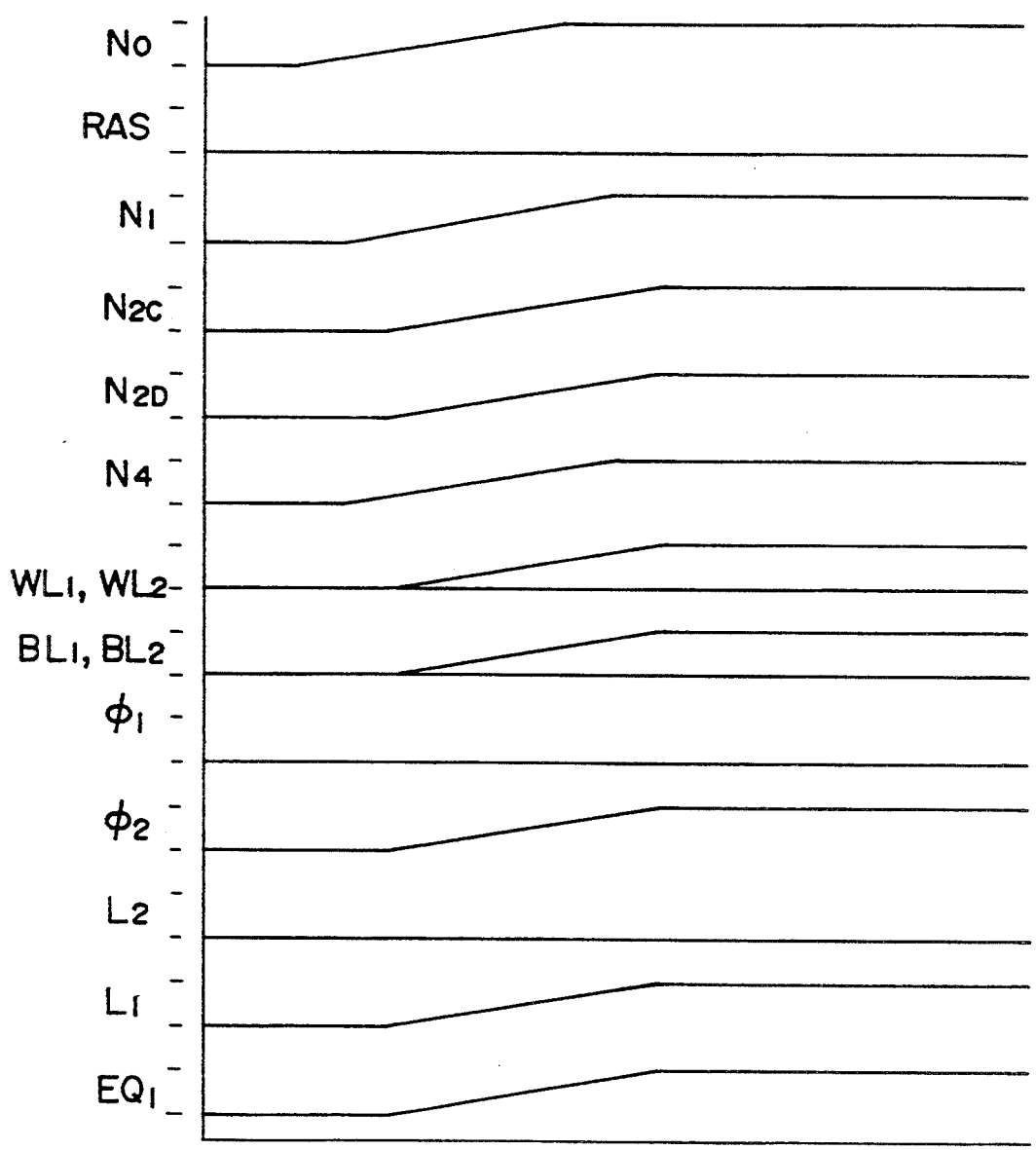

The operation of the semiconductor memory device shown in FIG. 15 at the time that the power supply thereof has been turned on, will next be described with reference to a timing chart shown in FIG. 17. FIG. 17 shows the operation of the semiconductor memory device at the time that a RAS is of an "L" upon turning on the power supply.

When the power supply is turned on, the potential of a node N0 is changed from a ground potential level (Vss level) to an external power potential level (Vcc level). Owing to its transition, an internal power supplying circuit 40 supplies the internal potential V1 to a node N1, whereas the internal power supplying circuit 40A supplies the internal potential V2 to the node N4. Further, a precharging circuit 50 supplies a potential V1/2 equal to half the V1 level to a node N2C in response to a variation in potential at the node N1.

Since the subsequent operation can be easily understood by reference to the description of the operating period (b) shown in the first embodiment, and its description will therefore be omitted.

When a latch terminal L1 is supplied with a potential (i.e., when it is charged), a PMOS 81 is first turned ON in response to a one-shot pulse of a control signal ∅1 as described above and the potential of a control signal ∅2 is then changed to the Vss level, so that a PMOS 82 is turned ON. Further, the potential at the latch terminal L1 is stably maintained at the V1 level. Such an operation is controlled at timings of the control signals ∅1 and ∅2.

However, if "variations" occur in the generation of the control signals upon turning on the power supply and the potentials of the control signals ∅1 and ∅2 are fixed to the Vss level and the V1 level respectively, then the PMOS 81 is held ON. As a result, the potential at the latch terminal L1 is raised to the external power potential level (Vcc level) larger than the internal power potential level (V1 level). Thus, the potential of either one of bit lines BL1 and BL2, which is electrically connected to the latch terminal L1 through either a PMOS 31 or a PMOS 32 held in an activated state, is brought to the Vcc level. If, at this time, the difference between the potential (Vcc level) of either the bit line BL1 or the bit line BL2 and the potential of an equalize signal EQ is greater than the threshold voltage of each of PMOSs 61 and 62 of a switching circuit (second switching circuit) 60, then either the PMOS 61 or the PMOS 62 is turned ON.

Further, since a system (system of a node N2B) for supplying the half potential V1/2 of the internal potential to each of memory cells 10 and 20 and a system (system of a node N2A) for supplying the potential V1/2 to the switching circuit (second switching circuit) 60 are separated from each other in the semiconductor memory device according to the present embodiment even if the above result is brought about, an excessive potential is not supplied to each of capacitors of the memory cells. Even if the potential of the node N2C is brought to the Vcc level, only a potential (Vcc-VT) reduced by a threshold voltage (VT) of an NMOS 53 is applied to a node N2D by the NMOS 53. Accordingly, an excessive potential is no longer supplied to each of the capacitors of the memory cells.

As has been described above, each of the first through fifth embodiments of the present invention has been described using an open bit line type DRAM. However, the present invention can also be applied to a folded bit line type DRAM in the same manner as described above.

Figure 18:
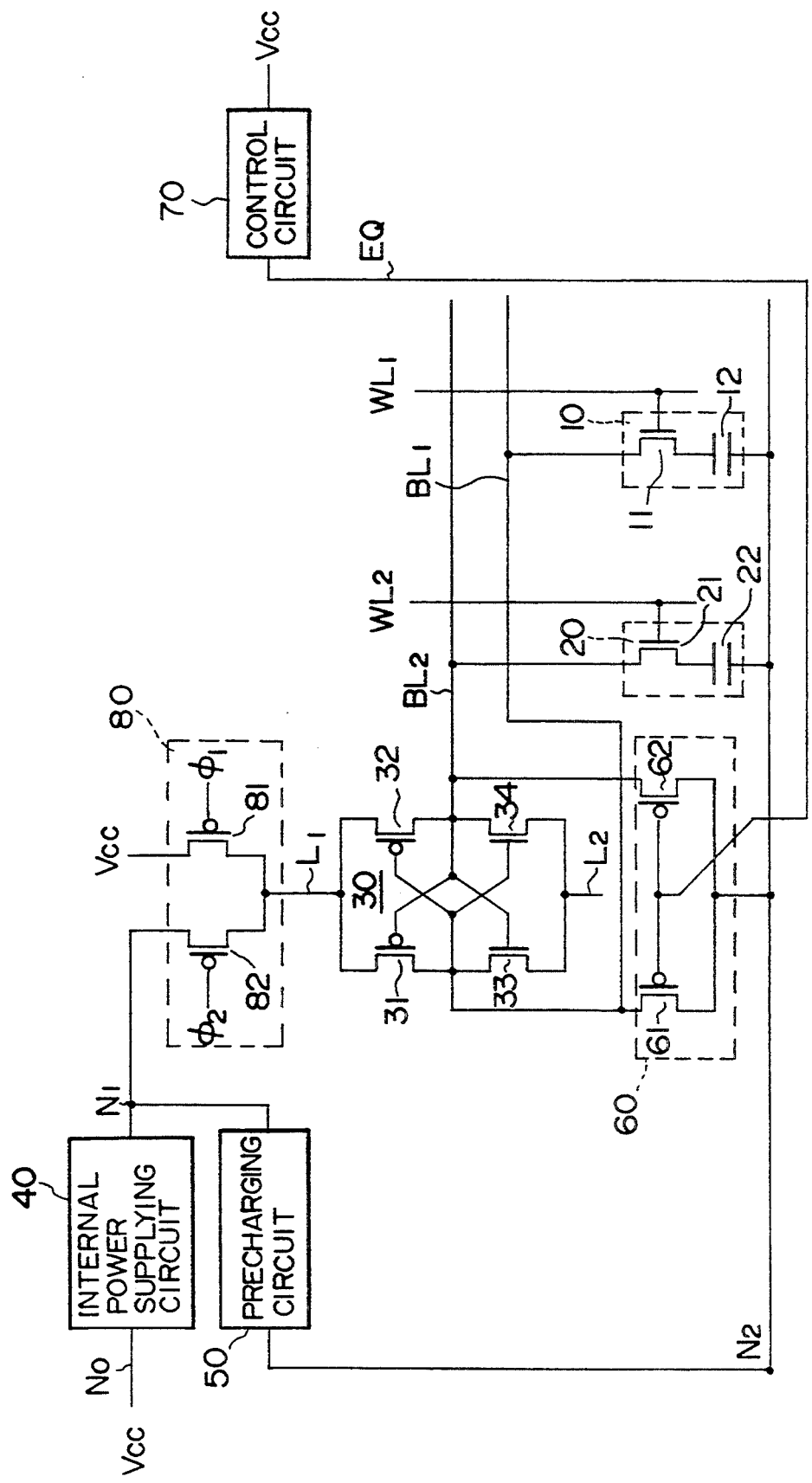
FIG. 18 is a fragmentary block diagram for describing a circuit configuration of the present invention applied to a folded bit line type DRAM.

FIG. 18 shows an embodiment in which the present invention is applied to the folded bit line type DRAM. In this case, the embodiment corresponding to the first embodiment of the present invention is illustrated in FIG. 18. The same elements of structure as those employed in the semiconductor memory device according to the first embodiment are identified by like reference numerals, and their description will therefore be omitted. The description omitted herein can be easily understood by reference to the description of the first embodiment.

The present embodiment is described using the folded bit line type DRAM corresponding to that employed in the first embodiment. However, this type of folded bit line type DRAM can also be applied to other embodiments in the same manner as described above.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory device comprising:
a first node and a second node;
a memory cell for storing data therein, including a first transistor having a first electrode, a second electrode and a gate electrode, and a capacitor connected to the first electrode;
a bit line connected to the second electrode and the first node;
a sense amplifier connected to the first and second nodes, for amplifying a potential of said first node;
a power supply for supplying a supply power potential to said second node;
a first switching circuit connected between said power supply and said second node, for connecting said power supply with said sense amplifier in response to a first control signal indicating a first logic level, the first control signal having either the first or a second logic level;

an internal power supplying circuit connected to said power supply, for supplying an internal potential less than the supply power potential;
a precharging circuit for providing a half potential of the internal potential to said memory cell and said bit line; a second switching circuit connected between said precharging circuit and said bit line, for connecting said bit line with said precharging circuit in response to a second control signal; and
a control circuit for outputting the second control signal having the supply power potential before transition of the first logic level of the first control signal into the second logic level.

2. The semiconductor memory device according to claim 1, further comprising:
a first conductive line connected between said precharging circuit and said second switching circuit, for transferring the half potential from said precharging circuit to said second switching circuit; and
a second conductive line connected between said precharging circuit and said memory cell, for transferring the half potential from said precharging circuit to said memory cell.

3. The semiconductor memory device according to claim 2, further comprising:
a second transistor having a gate electrode connected to the power supply, connected between said precharging circuit and said memory cell.

4. The semiconductor memory device according to claim 1, wherein said second switching circuit comprises a p channel type MOS transistor, a gate electrode of the p channel type MOS transistor is applied the second control signal thereto.

5. A semiconductor memory device comprising:
a first node and a second node;
a memory cell for storing data therein, including a first transistor having a first electrode, a second electrode a gate electrode, and a capacitor connected to the first electrode;
a bit line connected to the second electrode and the first node;
a sense amplifier connected to the first and second nodes, for amplifying a potential of said first node;
a power supply for supplying a supply power potential to said second node;
a first switching circuit connected between said power supply and said second node, for connecting said power supply with said sense amplifier in response to a first control signal indicating a first logic level, the first control signal having either the first or a second logic level;
a second switching circuit connected between a precharging circuit and said bit line, for connecting said bit line with said precharging circuit in response to a second control signal;
an internal power supplying circuit connected to said power supply, for supplying an internal potential less than the supply power potential;
said precharging circuit providing a half potential of the internal potential to said memory cell and said bit line;
a first conductive line connected between said precharging circuit and said second switching circuit;
a second conductive line connected between said precharging circuit and said memory cell; and a control circuit for outputting the second control signal before transition of the first logic level of the first control signal to the second logic level.

6. The semiconductor memory device according to claim 5, wherein said second switching circuit comprises a p-channel MOS transistor having a gate electrode, the second control signal applied to its gate electrode has the supply power potential.

7. The semiconductor memory device according to claim 5, wherein said second switching circuit comprises an n-channel MOS transistor having a gate electrode, the second control signal applied to its gate electrode has a ground potential.

8. A semiconductor memory device comprising:
a sense amplifier having cross-coupled first and second p channel transistors and cross-coupled first and second n channel transistors, each having a respective path of controllable conductivity and a control electrode;
first and second nodes within said sense amplifier, the first node being coupled to control electrodes of said second p channel transistor and said second n channel transistor, the second node being coupled to control electrodes of said first p channel transistor and said first n channel transistor;
a first memory cell for storing first data therein;
a second memory cell for storing second data therein;
a first bit line connected between the first node and said first memory
a second bit line connected to the second node and said second memory cell;
a power supply circuit for providing a source potential to said sense amplifier in response to a first control signal indicating a first logic level, the first control signal having either the first or a second logic level;
an internal power supplying circuit for supplying an internal potential less than the source potential;
a precharging circuit for providing a half potential of the internal potential to said memory cell and said bit line;
a second switching circuit connected between said precharging circuit and said bit line, for connecting said bit line with said precharging circuit in response to a second control signal; and
a control circuit for outputting the second control signal having the power supply source potential before transition the first logic level of the first control signal into the second logic level.

9. The semiconductor memory device according to claim 8, further comprising:
a first conductive line connected between said precharging circuit and said second switching circuit, for transferring the half potential from said precharging circuit to said second switching circuit; and
a second conductive line connected between said precharging circuit and said memory cell, for transferring the half potential from said precharging circuit to said memory cell.

10. The semiconductor memory device according to claim 9, further comprising:
a transistor having a gate electrode connected to the power supply, connected between said precharging circuit and said memory cell.

11. The semiconductor memory device according to claim 8, wherein said second switching circuit comprises a p channel type MOS transistor, a gate electrode of the p channel type MOS transistor is applied the second control signal thereto.

* * * * *